(12) United States Patent
Chiu et al.

(10) Patent No.: US 9,881,831 B2
(45) Date of Patent: *Jan. 30, 2018

(54) METHOD FOR FABRICATING SEMICONDUCTOR DEVICE INCLUDING FIN SHAPED STRUCTURE

(71) Applicant: UNITED MICROELECTRONICS CORP., Hsin-Chu (TW)

(72) Inventors: Chung-Yi Chiu, Tainan (TW); Shih-Fang Hong, Tainan (TW); Chao-Hung Lin, Changhua County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/465,606

(22) Filed: Mar. 22, 2017

(65) Prior Publication Data

US 2017/0194193 A1    Jul. 6, 2017

Related U.S. Application Data

(63) Continuation of application No. 14/855,390, filed on Sep. 16, 2015, now Pat. No. 9,722,078.

(30) Foreign Application Priority Data

Aug. 12, 2015    (TW) .............................. 104126243 A (51) Int. Cl.
*H01L 21/762* (2006.01)
*H01L 21/02* (2006.01)
*H01L 29/06* (2006.01)
*H01L 29/78* (2006.01)
*H01L 29/66* (2006.01)
*H01L 29/161* (2006.01)

(52) U.S. Cl.
CPC .. *H01L 21/76224* (2013.01); *H01L 21/02532* (2013.01); *H01L 29/0649* (2013.01); *H01L 29/161* (2013.01); *H01L 29/66795* (2013.01); *H01L 29/785* (2013.01)

(58) Field of Classification Search
CPC ........... H01L 21/02532; H01L 21/0245; H01L 29/7848; H01L 29/66795; H01L 29/785; H01L 2029/7858
See application file for complete search history.

(56) References Cited

U.S. PATENT DOCUMENTS

| | | |
|---|---|---|
| 7,635,632 B2 | 12/2009 | Yeo |
| 7,728,360 B2 | 6/2010 | Chen |
| 7,767,560 B2 | 8/2010 | Jin et al. |
| 8,679,950 B2 | 3/2014 | Fumitake |
| 8,703,565 B2 | 4/2014 | Chang et al. |
| 9,478,663 B2 | 10/2016 | Jacob |
| 9,484,266 B1 * | 11/2016 | Balakrishnan .. H01L 21/823821 |

(Continued)

*Primary Examiner* — Mohsen Ahmadi
(74) *Attorney, Agent, or Firm* — Winston Hsu (57) ABSTRACT

A semiconductor device and a method of fabricating the same, the semiconductor device includes a silicon substrate, a fin shaped structure and a shallow trench isolation. The fin shaped structure is disposed on the silicon substrate and includes a silicon germanium (SiGe) layer extending from bottom to top in the fin shaped structure. The shallow trench isolation covers a bottom portion of the fin shaped structure.

10 Claims, 5 Drawing Sheets

(56) References Cited

U.S. PATENT DOCUMENTS

| | | | |
|---|---|---|---|
| 9,524,969 B1* | 12/2016 | Balakrishnan | H01L 27/0924 |
| 2010/0144121 A1* | 6/2010 | Chang | H01L 29/1054 |
| | | | 438/478 |
| 2011/0024804 A1* | 2/2011 | Chang | H01L 29/165 |
| | | | 257/288 |
| 2011/0227165 A1 | 9/2011 | Basker | |
| 2012/0091528 A1 | 4/2012 | Chang | |
| 2012/0104472 A1 | 5/2012 | Xu | |
| 2013/0196478 A1* | 8/2013 | Chang | H01L 29/66795 |
| | | | 438/283 |
| 2014/0363935 A1 | 12/2014 | Fu | |
| 2016/0093535 A1 | 3/2016 | Xu | |
| 2016/0233245 A1 | 8/2016 | Hashemi | |
| 2017/0263749 A1* | 9/2017 | Chang | H01L 29/165 |

* cited by examiner

METHOD FOR FABRICATING SEMICONDUCTOR DEVICE INCLUDING FIN SHAPED STRUCTURE

CROSS REFERENCE TO RELATED APPLICATIONS

This application is a Continuation of application Ser. No. 14/855,390 filed Sep. 16, 2015, and included herein by reference.

BACKGROUND OF THE INVENTION

1. Field of the Invention

The invention relates to a method of fabricating a semiconductor device, and more particularly, to a method of fabricating a semiconductor device having a silicon germanium (SiGe) epitaxial structure.

2. Description of the Prior Art

With the trend in the industry being scaling down the size of the field effect transistors (FETs), three-dimensional or non-planar transistor technology, such as fin field effect transistor technology (FinFET) has been developed to replace planar FETs. Since the three-dimensional structure of a FinFET increases the overlapping area between the gate and the fin shaped structure of the silicon substrate, the channel region can therefore be more effectively controlled. This way, the drain-induced barrier lowering (DIBL) effect and the short channel effect (SCE) are reduced. The channel region is also longer for an equivalent gate length, thus the current between the source and the drain is increased.

However, layout designs of the FinFET structures still face some issues in conventional FinFET fabrication. Hence, how to improve the current FinFET fabrication and structure for resolving such issue has become an important task in this field.

SUMMARY OF THE INVENTION

It is one of the primary objectives of the present invention to provide a semiconductor device, which has a silicon germanium layer uniformly distributed in a fin shaped structure, so as to effectively improve the carrier mobility of the channel region thereof, as well as the element performance.

It is another one of the primary objectives of the present invention to provide a method of forming the semiconductor device, in which a silicon germanium layer may be formed uniformly in at least 80% to 90% of the fin shaped structure, so that, the method is able to improve the carrier mobility of the channel region in the semiconductor device, as well as the element performance thereof.

To achieve the purpose described above, the present invention provides a method of forming a semiconductor device including following steps. First of all, a fin shaped structure is formed on a silicon substrate, wherein the fin shaped structure consists of silicon. Next, an epitaxial layer is selectively formed on sidewalls of the fin shaped structure. Then, a germanium condensation process is performed to form a silicon germanium layer in the fin shaped structure, and to transfer the epitaxial layer to an oxide layer, wherein the silicon germanium layer extends in 80% to 90% of the fin shaped structure. Finally, a shallow trench isolation is formed after the condensation process, to cover the fin shaped structure.

To achieve the purpose described above, the present invention provides a method of forming a semiconductor device including following steps. First of all, a fin shaped structure is formed on a silicon substrate, wherein the fin shaped structure consists of silicon. Next, an epitaxial layer is selectively formed on sidewalls of the fin shaped structure and on a top surface of the silicon substrate. Then, a germanium condensation process is performed to form a silicon germanium layer in the fin shaped structure and in the top surface of the silicon substrate, and to transfer the epitaxial layer to an oxide layer, wherein the silicon germanium layer extends over the fin shaped structure from top to bottom. Finally, a shallow trench isolation is formed after the condensation process, to cover the fin shaped structure.

According to the above, the semiconductor device and the forming method thereof in the present invention mainly form an epitaxial layer on surfaces of the silicon-containing substrate and the fin shaped structures, and then perform a germanium condensation process. In this way, the epitaxial layer may react with oxygen to form an oxide layer, and the epitaxial layer may also experience condensation simultaneously, thereby driving the germanium inwardly into the fin shaped structures and the substrate. Thus, a great amount of germanium from the epitaxial layer may accumulate in the fin shaped structures and the substrate, such that, a silicon germanium layer may be formed accordingly in the fin shaped structures and the substrate. Thus, the semiconductor device of the present invention is able to stress the channel region of a semiconductor transistor formed subsequently due to the relative higher lattice constant of the silicon germanium layer in comparison with the silicon substrate, so that the present invention may achieve the purpose of increasing the carrier mobility and improving the element performance.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first embodiment of the present invention, in which:

FIG. 6 to FIG. 10 are schematic diagrams illustrating a method of forming a semiconductor device according to a second embodiment of the present invention, in which:

DETAILED DESCRIPTION

To provide a better understanding of the present invention, preferred embodiments will be described in detail. The preferred embodiments of the present invention are illustrated in the accompanying drawings with numbered elements.

Please refer to FIG. 1 to FIG. 5, which are schematic diagrams illustrating a method of forming a semiconductor device according to the first embodiment of the present invention. First of all, a substrate 100 is provided, for example including a semiconductor substrate, such as a silicon substrate, a silicon-containing substrate or a silicon-on-insulator (SOI) substrate, and at least one fin shaped structure 101 is formed on the substrate 100. In the embodiment of having the bulk silicon, the formation of the fin shaped structure 101 may include a spacer self-aligned double-patterning (SADP) process, also known as sidewall image transfer (SIT) process. The SADP process may include forming a plurality of patterned sacrificial layers (not shown in the drawings) on the substrate 100 by using a photolithography and etching process, performing a depositing and etching processes sequentially to form a spacer (not shown in the drawings) at sidewalls of each of the patterned sacrificial layers, and then removing the patterned sacrificial layers and performing another etching process by using the spacer as a mask, thereby transferring the patterns of the spacer to a monolayered or a multilayered patterned mask 110, like a composite mask structure consisted of a silicon oxide layer 111 and a silicon nitride layer 113. After that, another etching process is performed to transfer the patterns of the patterned mask 110 to the substrate 100 underneath, and to form a plurality of shallow trenches (not shown in the drawings) and to define the fin shaped structures 101 simultaneously.

Figure 1:
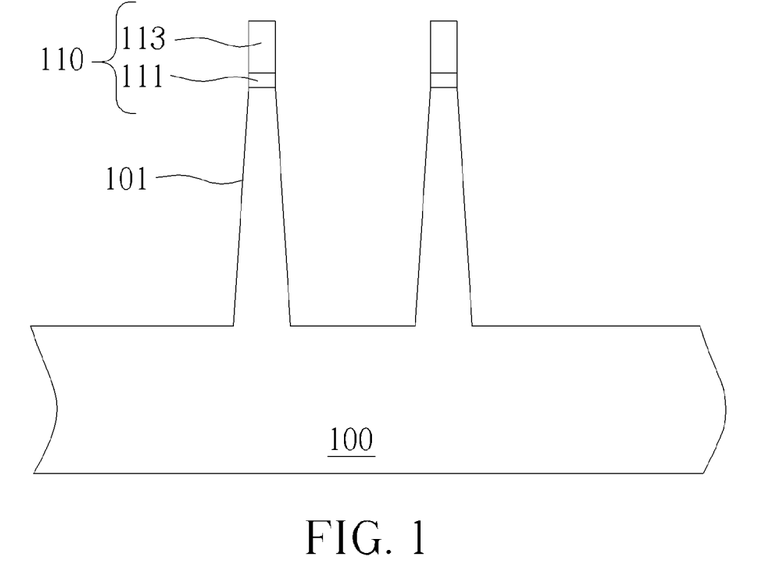
FIG. 1 shows a semiconductor device at the beginning of the forming process.

However, people skilled in the art shall easily realize that the formation of the fin shaped structures 101 in the present invention is not limited to the aforementioned processes, and may also be accomplished by other methods. For example, in one embodiment, the fin shaped structure 101 may also be formed by first forming a patterned hard mask (not shown in the drawings) on the substrate 100, and then performing an epitaxial process on the exposed substrate 100 through the patterned hard mask to form a semiconductor layer (not shown in the drawings), such as silicon or silicon germanium layer, to function like the corresponding fin shaped structures. Otherwise, in the embodiment of having the SOI substrate(not shown in the drawing), the patterned mask 110 may be used to etch a semiconductor layer (not shown in the drawings) on the substrate until reaching a bottom oxide layer (not shown in the drawing) underneath to form the corresponding fin shaped structures. Also, in another embodiment, a fin cut process may be further performed to remove a portion of the fin shaped structures 101, to form a fin shaped structure layout (not shown in the drawings) requested by the subsequent process, but is not limited thereto.

Figure 2:
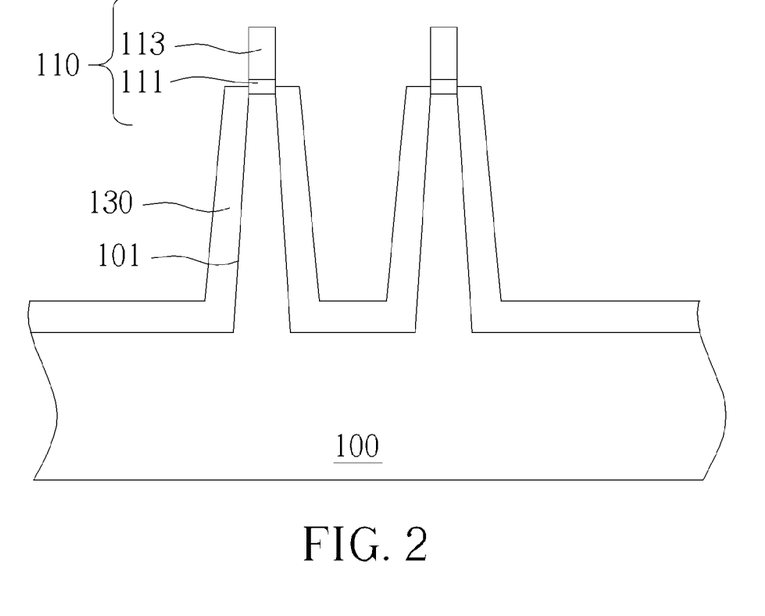
FIG. 2 shows a semiconductor device after forming an epitaxial layer.

Next, a selective epitaxial growing (SEG) process is performed, to form an epitaxial layer 130 on surfaces of the substrate 100 and the fin shaped structures 101. The epitaxial layer 130 may include a silicon germanium (SiGe) layer, a silicon germanium boron (SiGeB) layer or a silicon germanium tin (SiGeSn) layer, for example including around 20% to 50% germanium, but not limited thereto. In the present embodiment the epitaxial layer 130 may be formed conformally on all exposed silicon surfaces of the substrate 100 and the fin shaped structures 101. Preferably, a portion of the epitaxial layer 130 further extends above the boundary between the patterned mask 110 and the fin shaped structures 101. In other words, a top surface of the epitaxial layer 130 is higher than the boundary between the patterned mask 110 and the fin shaped structures 101, as shown in FIG. 2, but is not limited thereto. In another embodiment, an epitaxial layer (not shown in the drawings) having a top surface level with the aforementioned boundary may also be formed optionally.

Figure 3:
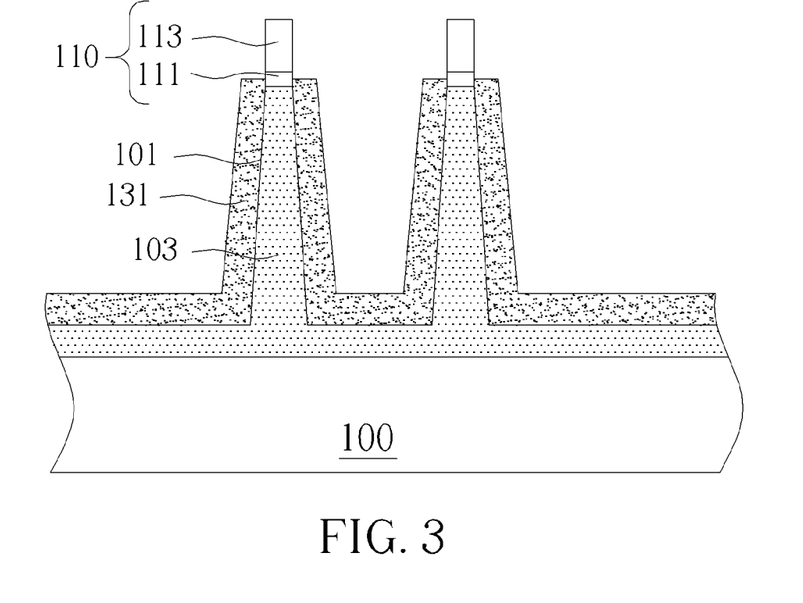
FIG. 3 shows a semiconductor device after performing a condensation process.

Following these, a germanium condensation process may be performed, to form a silicon germanium layer 103 in the fin shaped structures 101. Precisely speaking, the germanium condensation process may be performed in an aerobic environment at about 800° C. t0 1100° C. Through such performance, at least a portion of the epitaxial layer 130 may react with oxygen to form an oxide layer, and preferably the whole of the epitaxial layer 130 may react with oxygen to form the oxide layer, like a silicon oxide layer 131 for example. Meanwhile, under the aforementioned oxidation process, germanium within the epitaxial layer 130 may condense, thereby gradually driving inwardly to the fin shaped structures 101 and the substrate 100. In this situation, a great amount of germanium may be accumulated in the fin shaped structures 101 and the substrate 100, so that, the silicon germanium layer 103 may be formed accordingly in the silicon-containing fin shaped structures 101 and the substrate 100.

It is worth noting that, in a preferred embodiment, the epitaxial layer 130 may have a relative greater thickness or volume in comparison with the silicon germanium layer 103 formed sequentially, so that the silicon germanium layer 103 may be formed to distribute the whole of the fin shaped structures 101, and includes about 30% to 80% germanium, as shown in FIG. 3. However, people skilled in the art shall easily realize that the forming method of the silicon germanium layer is not limited to the aforementioned processes, and may include other methods. For example, in another embodiment, according to the practical requirements of the device, an epitaxial layer (not shown in the drawings) only covering a portion of the fin shaped structures 101 may also be formed; or the silicon oxide layer 131 maybe optionally removed after the germanium condensation process, and another epitaxial forming process and another germanium condensation process may be performed, to form a silicon geranium layer (not shown in the drawings) having higher preparation of germanium.

Following these, an insulating material layer (not shown in the drawings) may be formed on the substrate 100 preferably through a flowable chemical vapor deposition (FCVD) process, to cover the fin shaped structures 101, the patterned mask 110 and the silicon oxide layer 131, and a chemical mechanical polishing (CMP) process and an etching back process are then performed, to form an insulating layer 150 on the substrate 100. For example, the patterned mask 110 maybe firstly used as a stop layer to remove a portion of the insulating material layer, for planarizing the insulating material layer, the patterned mask 110 is then further used as a mask to etching another portion of the insulating material layer, and the patterned mask 110 is removed finally. In this manner, a portion of the fin shaped structures 101 may protrude from the insulating layer 150, so that, the insulating layer 150 may function like a shallow trench isolation (STI). In one embodiment, the insulating layer 150 covers the bottom of the fin shaped structures 101, and substantially covers about 20% to 50% of the height of the fin shaped structures 101, as shown in FIG. 4.

Figure 4:
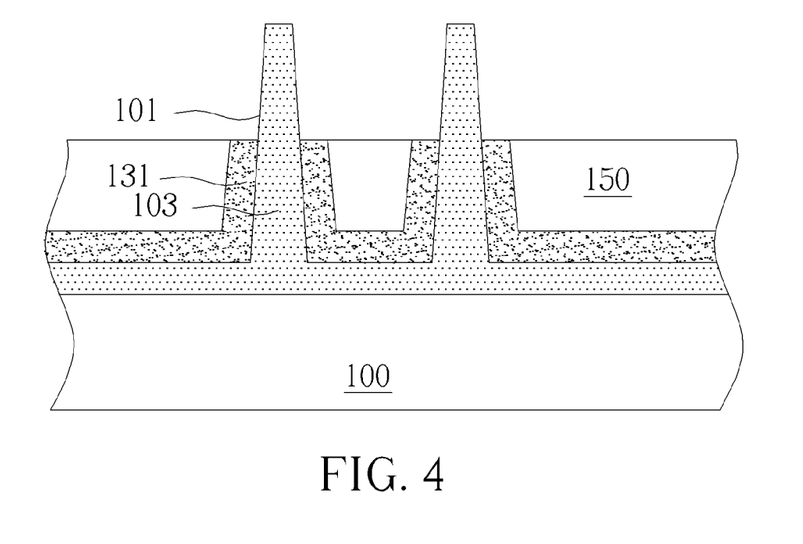
FIG. 4 shows a semiconductor device after forming a shallow trench isolation.

It is noted that, in the present embodiment, a portion of the patterned mask 110 (including the silicon nitride layer 113 and the silicon oxide layer 111) maybe removed selectively while the chemical mechanical polishing process and the etching back process are performed, due to structural characteristics of tri-gate transistor device formed subsequently, as shown in FIG. 4, but is not limited thereto. In other embodiments, the patterned mask 110 may also be partially removed or retained. Also, it is also worth noting that, the insulating layer 150 preferably includes a material having the same etching selectivity as the silicon oxide layer 131, such as silicon oxide, so that, the silicon oxide layer 131 covering the top portion of the fin shaped structures 101 may also be removed while the chemical mechanical polishing process and the etching back process are performed. Also, the silicon oxide layer 131 disposed on the bottom portion of the fin shaped structures 101 may also become a part of the shallow trench isolation, as shown in FIG. 4, but is not limited thereto. In another embodiment, after removing the silicon oxide layer 131, a liner (not shown in the drawings) may be further formed and the insulating layer 150 is formed then.

Figure 5:
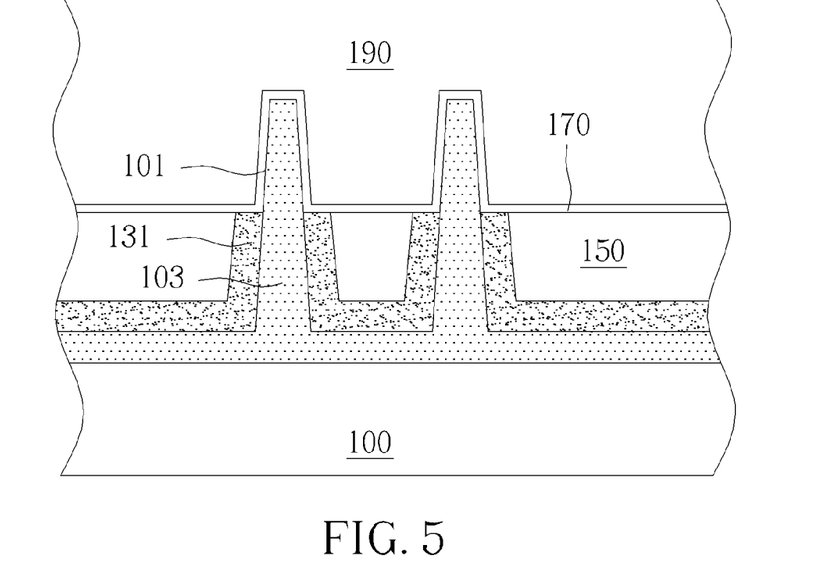
FIG. 5 shows a semiconductor device after forming a gate dielectric layer and a gate layer.

After that, an insulating layer and a conductive layer may be formed sequentially, to configure as a gate dielectric layer 170 and the gate layer 190. The gate dielectric layer 170 may include a monolayer structure or a multilayer structure, preferably including silicon oxide or suitable high-k materials. The formation of the gate dielectric layer 170 may include using an atomic layer deposition (ALD) process to form the gate dielectric layer 170 on the insulating layer 150 and the fin shaped structures 101 protruded from the insulating layer 150, as shown in FIG. 5, but is not limited thereto. In another embodiment, the gate dielectric layer may also be formed through an in situ steam generation (ISSG) process to uniformly form an insulating layer (not shown in the drawings) only on exposed surfaces of the fin shaped structures 101.

According to above-mentioned steps, the semiconductor device according to the first embodiment of the present invention is obtained. In the following, the method of the present invention may be integrated with a general gate forming process, to pattern the gate dielectric layer 170 and the gate layer 190, thereby forming a gate structure (not shown in the drawings) across the fin shaped structures 101. Otherwise, a source/drain selective epitaxial growing (SEG) process, a silicidation process, a contact etching stop layer (CESL) process or a replacement metal gate (RMG) process may be performed subsequently. Those processes are similar to a conventional forming process of a transistor and will not be further detailed herein.

The method of the present embodiment mainly forms an epitaxial layer on surfaces of the silicon-containing substrate and the fin shaped structures, and performs a germanium condensation process. In this way, the epitaxial layer may react with oxygen to form an oxide layer, and the epitaxial layer may condense simultaneously, thereby driving the germanium inwardly into the fin shaped structures and the substrate. Thus, a great amount of germanium from the epitaxial layer may accumulate in the fin shaped structures and the substrate, such that, a silicon germanium layer may be formed accordingly in the fin shaped structures and the substrate. Accordingly, the semiconductor device of the present invention is able to stress the channel region of a semiconductor transistor formed subsequently due to the relative higher lattice constant of the silicon germanium layer in comparison with the silicon substrate, so that the present invention may achieve the purpose of increasing the carrier mobility and improving the element performance.

The following description will detail the different embodiments of the semiconductor device and the forming method thereof of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
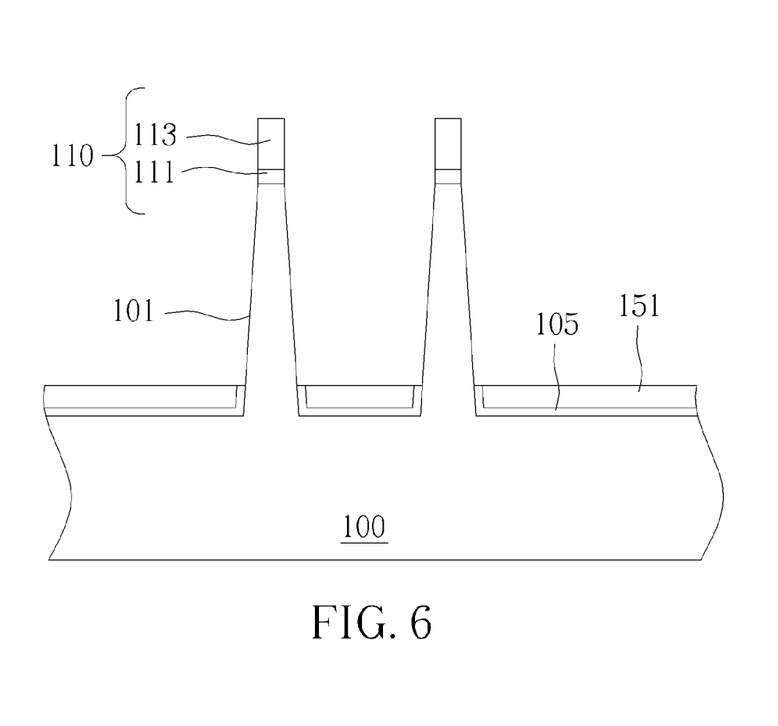
FIG. 6 shows a semiconductor device at the beginning of the forming process.
Figure 10:
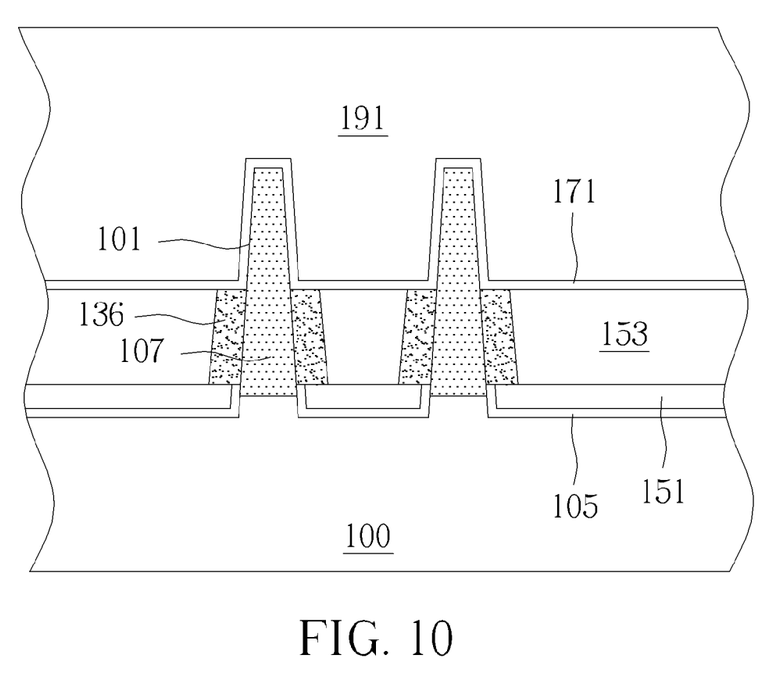
FIG. 10 shows a semiconductor device after forming a gate dielectric layer and a gate layer.

Please refer to FIG. 6 and FIG. 10, which are schematic diagrams illustrating a method of forming a semiconductor device according to the second embodiment of the present invention. The formal steps in the present embodiment are similar to those in the first embodiment, and which includes forming the substrate 100 and the fin shaped structures 101 as shown in FIG. 1. However, the differences between the present embodiment and the aforementioned first embodiment are that, a portion of a shallow trench isolation is firstly formed prior to an epitaxial layer 135 being formed.

Namely, in the present embodiment, an insulating layer 151 is formed right after the fin shaped structures 101 are formed, and the insulating layer 151 only partially covers a bottom portion of the fin shaped structures 101. The insulating layer 151 preferably only covers about 10% to 20% of the height of the fin shaped structures 101, so that, a portion of the fin shaped structures 101 (about 80% to 90% of the height of the fin shaped structures 101) may protrude from the insulating layer 151 and the insulating layer 151 may function like a first shallow trench isolation, as shown in FIG. 6. People skilled in the art shall easily realize that the forming method and detailed materials of the insulating layer 151 of the present embodiment are substantially similar to that of the insulating layer 150 in the aforementioned first embodiment or are well known in the art, and will not be further detailed herein. Also, in one embodiment, a liner 105 may be optionally formed on sidewalls of the fin shaped structures 101 and on surfaces of the substrate 100, before the insulating layer 151 is formed, so that, the liner 105 maybe disposed between the fin shaped structures 101 and the insulating layer 151 (also known as the first shallow trench isolation), as shown in FIG. 6, but is not limited thereto. In another embodiment, the liners 105 may also be omitted, and an insulating layer (not shown in the drawings) directly contacting and covering the bottom portion of the fin shaped structures 101 and the substrate 100 may also be formed.

Figure 7:
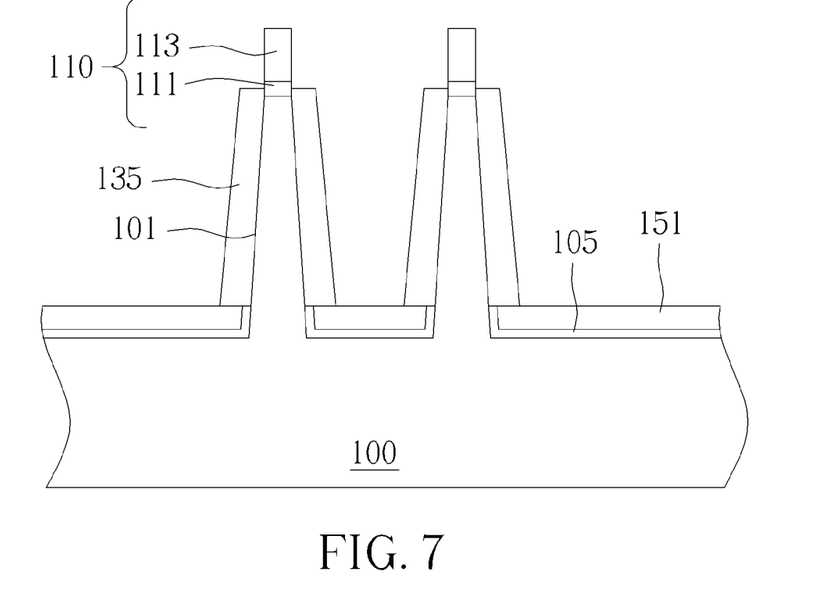
FIG. 7 shows a semiconductor device after forming an epitaxial layer.

Then, a selective epitaxial growing process is performed, to form the epitaxial layer 135 on exposed surfaces of the fin shaped structure 101. In the present embodiment, since the insulating layer 151 partially covers the bottom portion of the fin shaped structures 101, the epitaxial layer 135 may only be formed on the fin shaped structures 101 which is uncovered by the insulating layer 151, substantially being about 80% to 90% of the height of the fin shape structures 101, as shown in FIG. 7. Also similar to the epitaxial layer 130 of the aforementioned first embodiment, a portion of the epitaxial layer 135 of the present embodiment preferably further extends above the boundary between the patterned mask 110 and the fin shaped structures 101, thereby forming a top surface thereof being higher than the boundary between the patterned mask 110 and the fin shaped structures 101, as shown in FIG. 7, but is not limited thereto. However, other details of the selective epitaxial growing process and the detailed formation, materials and germanium contents of the epitaxial layer 135 are all similar to that in the aforementioned first embodiment or are well known in the art, and will not be redundantly described herein.

Figure 8:
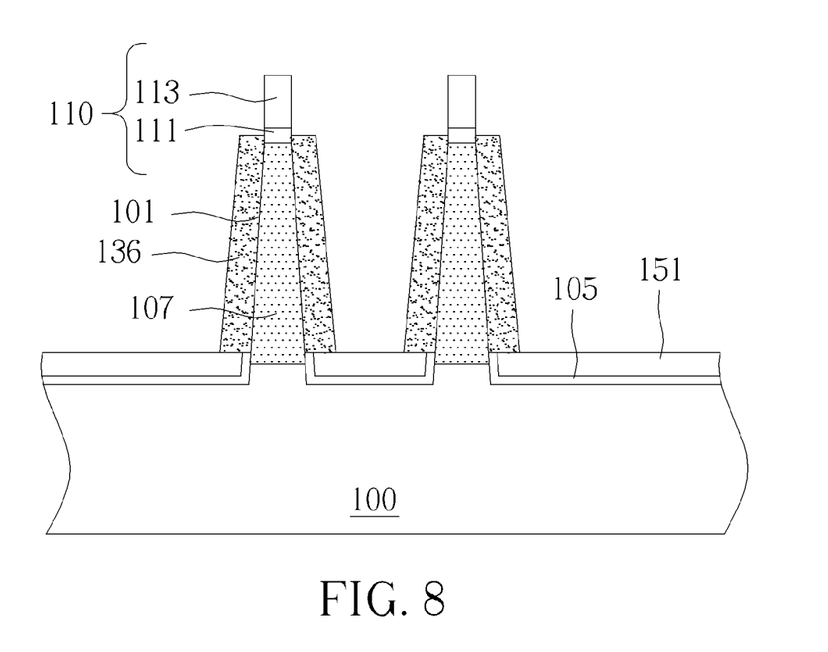
FIG. 8 shows a semiconductor device after performing a condensation process.

Next, a germanium condensation process may be performed, so that, the epitaxial layer 135 may react with oxygen to form a silicon oxide layer 136, and germanium of the epitaxial layer 135 may experience condensation simultaneously, thereby gradually driving inwardly into the fin shaped structures 101 to form a silicon germanium layer 107 having a great amount of germanium in the surfaces of the fin shaped structures 101. It is noted that, the epitaxial layer 135 only forms on the surfaces of the fin shaped structures 101 which is uncovered by the insulating layer 151 (about 80% to 90% of the height of the fin shaped structures 101). Thus, the silicon germanium layer 107 may be formed only on the fin shaped structures 101 which are covered by the epitaxial layer 135. In other words, the silicon germanium layer 107 may extend downwardly from the top of the fin shaped structures 101 and occupy about 80% to 90% of the fin shaped structures 101, but is not limited thereto. In another embodiment through tuning the process temperature or the process time of the germanium condensation process, the germanium of the epitaxial layer 135 may further spread over the covered portion of the fin shaped structures 101, as shown in FIG. 8. In other words, the silicon germanium, layer 107 may extend from the top of the fin shaped structures 101 till occupying about 80% to 90% of the height of the fin shaped structures 101, such that, the liner 105 may cover a portion of the silicon germanium layer 107. In another embodiment, the silicon germanium layer 107 may also extend below the boundary between the silicon oxide layer 136 (or epitaxial layer 135) and the insulating layer 151, thereby obtaining a bottom surface being lower than a top surface of the insulating layer 151, as shown in FIG. 8.

Figure 9:
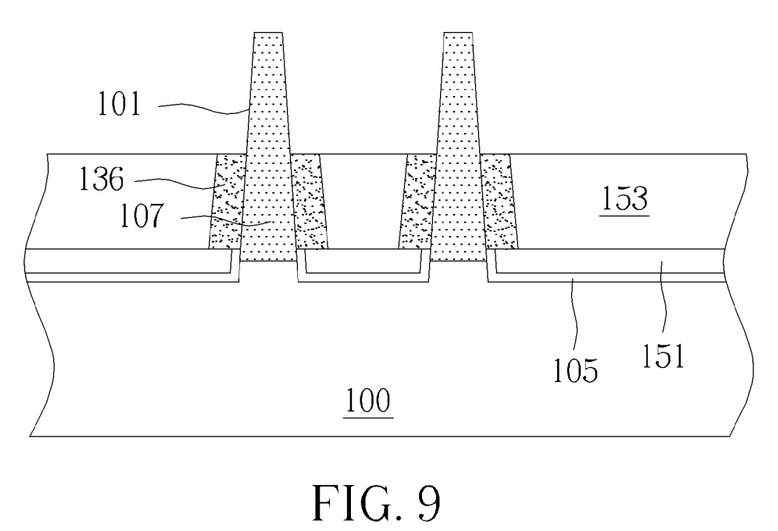
FIG. 9 shows a semiconductor device after forming a shallow trench isolation.

Following these, an insulating layer 153 may be formed, to function like a second shallow trench isolation. The forming method of the insulating layer 153 may include firstly forming an insulating material layer (not shown in the drawings) on the substrate 100 through a flowable chemical vapor deposition (FCVD) process, and a chemical mechanical polishing (CMP) process and an etching back process are then performed, to remove a portion of the insulating material layer to form the insulating layer 153. In this situation, a portion of the fin shaped structures 101 may protrude from the insulating layers 151, 153, so that, the insulating layer 153 may function like the second shallow trench isolation, as shown in FIG. 9.

It is worth noting that, the insulating layer 153 preferably includes a material having the same etching selectivity as the silicon oxide layer 136 and the insulating layer 151, like silicon oxide for example. Thus, the silicon oxide layer 136 covering the top portion of the fin shaped structure 101 may also be removed while the chemical mechanical polishing process and the etching back process are performed, so that, the first shallow trench isolation (namely the insulating layer 151) formed above, the silicon oxide layer 136 disposed on the bottom portion of the fin shaped structure 101, and the insulating layer 153 may configure as a shallow trench isolation surrounding the fin shaped structures 101, as shown in FIG. 9. The shallow trench isolation (including the first shallow trench isolation and the second shallow trench isolation) covers about 20% to 50% of the fin shaped structures 101. In the following, the patterned mask 110 (including the silicon nitride layer 113 and the silicon oxide layer 111) may be removed, as shown in FIG. 9, but is not limited thereto.

After that, a gate dielectric layer 171 and the gate layer 191 are formed sequentially. Generally, the forming methods and detailed materials of the gate dielectric layer 171 and the gate layer 191 are substantially similar to that of the aforementioned first embodiment or are well known in the art, and will not be further detailed herein. Precisely speaking, the gate dielectric layer 171 is formed on the second shallow trench isolation (namely, the insulating layer 153) and the rest of the silicon oxide layer 136, and also covers the fin shaped structures 101 disposed outside the shallow trench isolation, as shown in FIG. 10, but is not limited thereto. In another embodiment, the gate dielectric layer may also be formed through an in situ steam generation process to uniformly form a gate dielectric layer (not shown in the drawings) only on exposed surfaces of the fin shaped structures 101.

According to above mentioned steps, the semiconductor device according to the second embodiment of the present invention is obtained. In the following, the method of the present invention may be integrated with a general gate forming process, to pattern the gate dielectric layer 171 and the gate layer 191, thereby forming a gate structure (not shown in the drawings) across the fin shaped structures 101. Otherwise, a source/drain selective epitaxial growing (SEG) process, a silicidation process, a contact etching stop layer (CESL) process or a replacement metal gate (RMG) process may be performed subsequently. Those processes are similar to a conventional forming process of a transistor and will not be further detailed herein. In the method of the present embodiment, the shallow trench isolation is formed partially both before and after the epitaxial layer is formed, such that, the epitaxial layer only disposed on the surfaces of the fin shaped structures may be formed accordingly. In this manner, the silicon germanium layer only disposed in the fin shaped structures may be formed, while the germanium condensation process is performed, and the silicon germanium layer may occupy at least about 80% to 90% of the height of the fin shaped structures.

Through the above mentioned embodiments, the semiconductor device formed in the present invention is able to stress the channel region of a semiconductor transistor formed subsequently due to the relative higher lattice constant of the silicon germanium layer in comparison with the silicon substrate, so that the present invention may achieve the purpose of increasing the carrier mobility and improving the element performance. Also, the silicon germanium layer may either occupy at least about 80% to 90% of the height of the fin shaped structures, or distribute over the whole of the fin shaped structures, so as to effectively and uniformly increasing the carrier mobility of the device formed subsequently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor device, comprising:
   forming a fin shaped structure on a silicon substrate, wherein the fin shaped structure consists of silicon;
   selectively forming an epitaxial layer on sidewalls of the fin shaped structure and on a top surface of the silicon substrate;
   performing a condensation process to form a silicon germanium layer in the fin shaped structure and to transfer the epitaxial layer to an oxide layer, wherein the silicon germanium layer extends over the fin shaped structure and occupies the whole fin shape structure from top to bottom, and the silicon germanium layer further extends to the silicon substrate for being partially formed under the top surface of the silicon substrate;

forming a shallow trench isolation covering the fin shaped structure, after the condensation process, and removing a portion of the oxide layer while forming the shallow trench isolation, to leave a top portion of the germanium layer within the fin shaped structure protruded from the removed oxide layer and the shallow trench isolation.

2. The method of forming a semiconductor device according to claim 1, wherein the condensation process is performed at 800° C. to 1100° C.

3. The method of forming a semiconductor device according to claim 1, wherein the forming of shallow trench isolation comprises:

forming an insulating material layer on the silicon substrate after the condensation process, for covering the fin shaped structure; and removing a portion of the insulating material layer to form the shallow trench isolation covering 20% to 50% of the fin shaped structure.

4. The method of forming a semiconductor device according to claim 1, wherein the epitaxial layer comprises 20% to 50% germanium.

5. The method of forming a semiconductor device according to claim 1, wherein the silicon germanium layer comprises 30% to 80% germanium.

6. A method of forming a semiconductor device, comprising:

forming a fin shaped structure on a silicon substrate, wherein the fin shaped structure consists of silicon;

forming a first shallow trench isolation covering a bottom portion of the fin shaped structure and a top surface of the silicon substrate;

forming a liner on a lower sidewall of the fin shaped structure and on the top surface of the silicon substrate before the first shallow trench isolation;

selectively forming an epitaxial layer on sidewalls of the fin shaped structure, wherein the bottom portion of the fin shaped structure is uncovered by the epitaxial layer;

performing a condensation process to form a silicon germanium layer in the fin shaped structure, and to transfer the epitaxial layer to an oxide layer, wherein the silicon germanium layer extends within the fin shaped structure and occupies 80% to 90% of a height of the fin shaped structure from top to bottom, and a top surface of the first shallow trench isolation is higher than a bottom surface of the silicon germanium layer within the fin shaped structure; and forming a shallow trench isolation covering the fin shaped structure, after the condensation process.

7. The method of forming a semiconductor device according to claim 6, wherein the silicon germanium layer extends in a portion of the bottom portion of the fin shaped structure.

8. The method of forming a semiconductor device according to claim 6, wherein the first shallow trench isolation covers 10% to 20% of the fin shaped structure, and the shallow trench isolation covers 20% to 50% of the fin shaped structure.

9. The method of forming a semiconductor device according to claim 6, wherein the forming of shallow trench isolation comprises:

forming an insulating material layer on the first shallow trench isolation and the silicon substrate, after the condensation process; and removing a portion of the insulating material layer to form the shallow trench isolation.

10. The method of forming a semiconductor device according to claim 6, wherein the condensation process is performed at 800° C. to 1100° C.

* * * * *